(12) United States Patent
Hwang et al.

(10) Patent No.: US 9,054,693 B2
(45) Date of Patent: Jun. 9, 2015

(54) DATA DRIVER AND METHOD OF DRIVING THE SAME

(75) Inventors: Moon-Sang Hwang, Yongin-si (KR); Sang-Jun Cho, Yongin-si (KR); Dong-Yong Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 312 days.

(21) Appl. No.: 13/591,197

(22) Filed: Aug. 21, 2012

(65) Prior Publication Data

US 2013/0257486 A1  Oct. 3, 2013

(30) Foreign Application Priority Data

Mar. 28, 2012  (KR) .................. 10-2012-0031813

(51) Int. Cl.
G09G 3/00  (2006.01)
H03K 19/0175  (2006.01)
G09G 3/32  (2006.01)

(52) U.S. Cl.
CPC .............. *H03K 19/0175* (2013.01); *G09G 3/00* (2013.01); *G09G 3/3225* (2013.01); *G09G 2300/0842* (2013.01); *G09G 2310/0251* (2013.01); *G09G 2340/16* (2013.01)

(58) Field of Classification Search
USPC ........... 345/87, 88, 94, 98, 99, 100, 204, 205, 345/208, 211, 213, 212; 349/48, 42; 257/59, 72
See application file for complete search history.

(56) References Cited

U.S. PATENT DOCUMENTS

2002/0063674 A1* 5/2002 Chiang ........................... 345/98
2002/0067785 A1* 6/2002 Tanahashi ..................... 375/354

FOREIGN PATENT DOCUMENTS

| KR | 2001-0082791 A | 8/2001 |
| KR | 10-2004-0000780 A | 1/2004 |
| KR | 10-2007-0117923 A | 12/2007 |
| KR | 10-2008-0082815 A | 9/2008 |

* cited by examiner

*Primary Examiner* — Shaheda Abdin
(74) *Attorney, Agent, or Firm* — Christie, Parker & Hale, LLP

(57) ABSTRACT

A data driver capable of generating pre-emphasis voltages is provided. The data driver includes a pre-emphasis unit for comparing previous input data signals with current input data signals to generate pre-emphasis data signals, a first register unit for storing the current input data signals from the pre-emphasis unit and for supplying the previous input data signals to the pre-emphasis unit, and a second register unit for storing the pre-emphasis data signals.

11 Claims, 3 Drawing Sheets

DATA DRIVER AND METHOD OF DRIVING THE SAME

CROSS-REFERENCE TO RELATED APPLICATION

This application claims priority to and the benefit of Korean Patent Application No. 10-2012-0031813, filed on Mar. 28, 2012 in the Korean Intellectual Property Office, the entire content of which is incorporated herein by reference.

BACKGROUND

1. Field

Aspects of embodiments of the present invention relate to a data driver and a method of driving the data driver.

2. Description of the Related Art

Recently, various flat panel displays (FPDs) having reduced weight and volume compared to that of cathode ray tube (CRT) displays have been developed. The FPDs include liquid crystal displays (LCDs), field emission displays (FEDs), plasma display panels (PDPs), and organic light emitting displays.

Among the FPDs, the organic light emitting displays display images using organic light emitting diodes (OLEDs) that generate light by re-combination of electrons and holes. The organic light emitting display has high response speed and is driven with low power consumption.

The organic light emitting display includes a plurality of pixels arranged at crossing regions of a plurality of data lines, scan lines, and power source lines in a matrix. Each of the pixels generally includes an OLED, at least two transistors including a driving transistor, and at least one capacitor.

Recent organic light emitting displays have achieved high resolution and a large size. However, in the case of a large panel, the data charging time of each of the pixels is reduced so that an image of desired brightness is not displayed.

SUMMARY

Accordingly, aspects of embodiments of the present invention relate to a data driver and a method of driving the data driver, and more particularly, to a data driver capable of generating pre-emphasis voltages and a method of driving the data driver. Further embodiments of the present invention relate to a data driver capable of generating pre-emphasis voltages without using a separate line buffer to store previous input data signals used to generate the pre-emphasis voltages, and a method of driving the data driver.

According to an exemplary embodiment of the present invention, a data driver is provided. The data driver includes a pre-emphasis unit for comparing previous input data signals with current input data signals to generate pre-emphasis data signals, a first register unit for storing the current input data signals from the pre-emphasis unit and for supplying the previous input data signals to the pre-emphasis unit, and a second register unit for storing the pre-emphasis data signals.

The first register unit may include a first first-in-first-out (FIFO) register to store the current input data signals to correspond to a first clock signal.

The second register unit may include a second FIFO register.

The data driver may further include a delay unit between the first register unit and the pre-emphasis unit.

The delay unit may include at least one flip-flop driven by the first clock signal.

The data driver may further include a first holding latch unit for storing the current input data signals stored in the first register unit, a second holding latch unit for storing the pre-emphasis data signals stored in the second register unit, a multiplexer unit coupled to the first holding latch unit and the second holding latch unit to output one of the current input data signals or the pre-emphasis data signals to channels using multiplexers in the channels, and a signal generator for generating output data signals using the data signals output from the multiplexer unit and supplying the generated output data signals to data lines.

The data driver may further include an output stage positioned between the signal generator and the data lines, and including buffers in the channels.

The pre-emphasis unit may include a subtracting unit for subtracting the previous input data signals from the current input data signals to generate subtraction data signals, an operating unit for dividing the subtraction data signals by different powers of 2 to generate a plurality of operation data signals, a selecting unit for selecting a subset of the operation data signals to correspond to a control signal and for outputting a first sum of the selected operation data signals, and an adding unit for adding the first sum to the current input data signals.

The operating unit may include a plurality of division units. Each of the division units may generate a corresponding one of the operation data signals by shifting the subtraction data signals by a corresponding number of bits.

According to another exemplary embodiment of the present invention, a method of driving a data driver is provided. The method includes supplying current input data signals to a first register unit while receiving previous input data signals from the first register unit, comparing the current input data signals with the previous input data signals to generate pre-emphasis data signals, storing the pre-emphasis data signals in a second register unit, generating first output data signals using the pre-emphasis data signals and generating second output data signals using the current input data signals, and supplying the first output data signals and the second output data signals to data lines at different times.

The first register unit and the second register unit may include first-in-first-out (FIFO) registers.

The generating of the pre-emphasis data signals may include subtracting the previous input data signals from the current input data signals to generate subtraction data signals, dividing the subtraction data signals by different powers of 2 to generate a plurality of operation data signals, selecting a subset of the operation data signals and outputting a first sum of the selected operation data signals, and adding the first sum to the current input data signals to generate the pre-emphasis data signals.

In a data driver according to an embodiment of the present invention and a method of driving the data driver, a first register unit for storing current input data signals includes a FIFO register so that the previous line's input data signals may be supplied to a pre-emphasis unit without need of a separate line buffer. That is, according to aspects of the present invention, since the previous input data signals may be supplied to the pre-emphasis unit without needing a separate line buffer, it is possible to reduce manufacturing cost and to reduce or minimize the area of the data driver.

BRIEF DESCRIPTION OF THE DRAWINGS

The accompanying drawings, together with the specification, illustrate exemplary embodiments of the present inven

DETAILED DESCRIPTION

Figure 1:
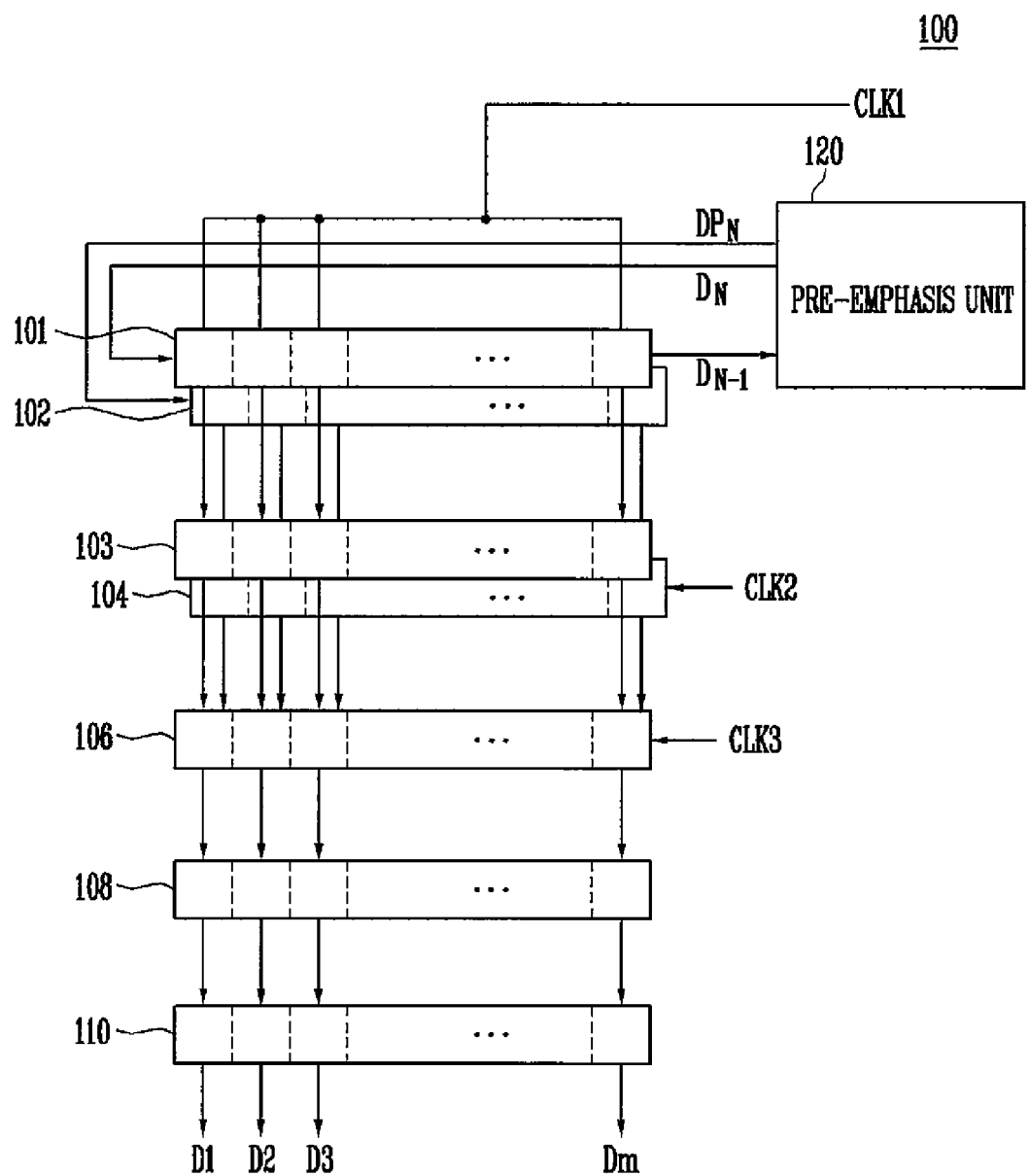
- FIG. 1 is a schematic view illustrating a data driver according to a first embodiment of the present invention.

Hereinafter, certain exemplary embodiments according to the present invention will be described with reference to the accompanying drawings. Here, when a first element is described as being coupled to a second element, the first element may be directly coupled (e.g., connected) to the second element or may be indirectly coupled (e.g., electrically connected) to the second element via one or more third elements. Further, some of the elements that are not essential to a complete understanding of the invention may be omitted for clarity. In addition, like reference numerals refer to like elements throughout.

One technique for handling shorter data signal charging times in data drivers of display devices is to supply pre-emphasis voltages during a partial period of each horizontal period, where each horizontal period is for charging the pixels of a corresponding row of the display device. Pre-emphasis voltages may be generated for each column by comparing the corresponding input data signals of the previous row with those of the current row. The corresponding input data signals for the previous row can be stored in a separate line buffer when generating the pre-emphasis voltages for the current row. However, the size of this line buffer circuit can take up a large amount of circuit area. Accordingly, embodiments of the present invention supply pre-emphasis voltages without the need for a separate line buffer.

Hereinafter, data drivers and methods of driving the data drivers will be described in detail with reference to FIGS. 1 to 5 in which exemplary embodiments by which those of ordinary skill in the art may practice the present invention without undue experimentation are disclosed.

FIG. 1 is a schematic view illustrating a data driver 100 according to a first embodiment of the present invention. In FIG. 1, for convenience sake, it is assumed that the data driver 100 includes m (m is a natural number) channels (for example, one channel per column of the display device).

Referring to FIG. 1, the data driver 100 includes first and second register units 101 and 102, first and second holding latch units 103 and 104, a multiplexer unit 106, a signal generator 108, and an output stage 110. In addition, the data driver 100 includes a pre-emphasis unit 120 for supplying current input data signals and for generating pre-emphasis data signals (for example, digital data signals).

The first register unit 101 sequentially stores current input data signals $D_N$ (corresponding to an Nth row of pixels) supplied from the pre-emphasis unit 120 to correspond to a first clock signal CLK1 supplied from the outside. The first register unit 101 includes a first-in-first-out (FIFO) register. Therefore, the first register unit 101 sequentially stores the current input data signals $D_N$ supplied from the pre-emphasis unit 120 at one end of the first register unit 101 (e.g., the left end, as illustrated in FIG. 1) and concurrently (for example, simultaneously) transmits previous input data signals $D_{N-1}$ (corresponding to the (N−1)th row of pixels) to the pre-emphasis unit 120 from another end of the first register unit 101 (e.g., the right end). The current input data signals $D_N$ and the previous input data signals $D_{N-1}$ may be, for example, digital data signals.

In more detail, the first register unit 101 includes the FIFO register. In this case, when processing the (N−1)th row, m input data signals $D_{N-1}$ supplied from the pre-emphasis unit 120 are sequentially stored in the first register unit 101 (for example, to correspond to the first clock signal CLK1). After the m input data signals $D_{N-1}$ are stored in the first register unit 101 and used as the input data signals for the (N−1)th row, processing moves to the next row (that is, the Nth row). Accordingly, as the current input data signals $D_N$ are input to one end of the first register unit 101, the previous input data signals $D_{N-1}$ are output from the other end of the first register unit 101 and supplied to the pre-emphasis unit 120 in the order in which the previous input data signals $D_{N-1}$ were stored in the first register unit 101.

Since the m input data signals $D_{N-1}$ are supplied to the pre-emphasis unit 120 in the order in which the m input data signals $D_{N-1}$ were stored in the first register unit 101, the m input data signals $D_{N-1}$ supplied to the pre-emphasis unit 120 may be used as the previous input data signals $D_{N-1}$. For example, according to an embodiment of the present invention, the current input data signals $D_N$ may correspond to a specific horizontal line (e.g., the Nth row) and the previous input data signals $D_{N-1}$ may correspond to the horizontal line prior to the specific horizontal line (e.g., the (N−1)th row).

The second register unit 102 sequentially stores the pre-emphasis data signals $DP_N$ supplied from the pre-emphasis unit 120 to also correspond to the first clock signal CLK1. The second register unit 102 also includes a FIFO register.

The first holding latch unit 103 receives and stores the current input data signals $D_N$ from the first register unit 101 to correspond to a second clock signal CLK2. The first holding latch unit 103 supplies the current input data signals $D_N$ stored therein to the multiplexer unit 106. Therefore, the first holding latch unit 103 may include m holding latches.

The second holding latch unit 104 receives and stores the pre-emphasis data signals $DP_N$ from the second register unit 102 to correspond to the second clock signal CLK2. The second holding latch unit 104 supplies the pre-emphasis data signals $DP_N$ stored therein to the multiplexer unit 106. Therefore, the second holding latch unit 104 may also include m holding latches.

The multiplexer unit 106 supplies the current input data signals $D_N$ or the pre-emphasis data signals $DP_N$ to the signal generator 108 to correspond to a third clock signal CLK3. Therefore, the multiplexer unit 106 may include m multiplexers, one for each channel. The multiplexers thus receive the current input data signals $D_N$ and the pre-emphasis data signals $DP_N$ corresponding to their respective channels.

The signal generator 108 receives the current input data signals $D_N$ or the pre-emphasis data signals $DP_N$ from the multiplexer unit 106 and generates output data signals (for example, analog data signals or data voltages) to correspond to the bits (e.g., digital data) of the received input data signals. Therefore, the signal generator 108 may include m digital analog converters (DACs). Each of the DACs may, for example, generate an analog output data signal corresponding to the digital bit data of the digital input data signal input thereto and supply the generated output data signal to the output stage 110.

The output stage 110 receives the output data signals from the signal generator 108 and transmits the received output data signals to data lines D1 to Dm. Therefore, the output stage 110 may include m buffers, one buffer for each of the channels. In other embodiments, the output stage 110 may be omitted in accordance with the intention of a designer. In this case, the signal generator 108 and the data lines D1 to Dm may be directly coupled to each other.

The pre-emphasis unit 120 compares the current input data signals $D_N$ with the corresponding previous input data signals $D_{N-1}$ and generates the pre-emphasis data signals $DP_N$ to correspond to the comparison result. The pre-emphasis unit 120 generates the pre-emphasis data signals $DP_N$ so that the pre-emphasis data signals $DP_N$ have larger values than the current input data signals $D_N$ when the current input data signals $D_N$ have larger values than the corresponding previous input data signals $D_{N-1}$.

For example, when the pre-emphasis data signals $DP_N$ and the current and previous input data signals $D_N$ and $D_{N-1}$ are digital data signals (e.g., bit values), then one such data signal may be said to have a larger value than another if it has a higher bit value than the other (and likewise, one such data signal may be said to have a smaller value than another if it has a lower bit value than the other). For ease of description, the pre-emphasis data signals $DP_N$ and the current and previous input data signals $D_N$ and $D_{N-1}$ are assumed to be digital data signals taking on discrete bit values, though the invention is not limited thereto.

In more detail, when the current input data signals $D_N$ have larger values than the corresponding previous input data signals $D_{N-1}$, the corresponding output data signals of the current input data signals $D_N$ are set to have higher voltages than the corresponding output data signals of the previous input data signals $D_{N-1}$. In this case, when output data signals corresponding to the pre-emphasis data signals $DP_N$ have higher voltages than the corresponding output data signals of the current input data signals $D_N$ and are then supplied to their respective data lines D1 to Dm (for example, in a partial period of the current horizontal period for processing the current input data signals $D_N$), the output voltages of the previous input data signals $D_{N-1}$ may be increased (for example, instantaneously increased) so that the charging time of the corresponding pixels may be secured (and the pixels sufficiently charged) in the current horizontal period.

In a similar fashion, when the current input data signals $D_N$ have smaller values than the corresponding previous input data signals $D_{N-1}$, the corresponding output data signals of the current input data signals $D_N$ are set to have lower voltages than the corresponding output data signals of the previous input data signals $D_{N-1}$. In this case, when output data signals corresponding to the pre-emphasis data signals $DP_N$ have lower voltages than the corresponding output data signals of the current input data signals $D_N$ and are then supplied to their respective data lines D1 to Dm (for example, in a partial period of the current horizontal period for processing the current input data signals $D_N$), the output voltages of the previous input data signals $D_{N-1}$ may be reduced (for example, instantaneously reduced) so that the charging time of the corresponding pixels may be secured (and the pixels sufficiently charged) in the current horizontal period.

The operation processes of the data driver 100 will now be described in further detail. First, the pre-emphasis unit 120 sequentially supplies the current input data signals $D_N$ supplied from the outside (for example, a timing controller) to the first register unit 101 and concurrently receives (for example, simultaneously receives) the previous input data signals $D_{N-1}$ from the first register unit 101 to correspond to the first clock signal CLK1. The pre-emphasis unit 120 generates the pre-emphasis data signals $DP_N$ using the current input data signals $D_N$ and the previous input data signals $D_{N-1}$, and stores the generated pre-emphasis data signals $DP_N$ in the second register unit 102 to correspond to the first clock signal CLK1.

Then, the first holding latch unit 103 receives and stores the current input data signals $D_N$ from the first register unit 101 while the second holding latch unit 104 receives and stores the pre-emphasis data signals $DP_N$ from the second register unit 102 to correspond to the second clock signal CLK2. The current input data signals $D_N$ and the pre-emphasis data signals $DP_N$ stored in the holding latch units 103 and 104 are supplied to the multiplexer unit 106.

The multiplexer unit 106 outputs the pre-emphasis data signals $DP_N$ in a partial period of one horizontal period and outputs the current input data signals $D_N$ in the remaining period of the one horizontal period to correspond to the third clock signal CLK3. The periods in which the pre-emphasis data signals $DP_N$ and the current input data signals $D_N$ are output may be variously set to correspond to a driving method.

The signal generator 108 generates the output data signals corresponding to the current input data signals $D_N$ or the pre-emphasis data signals $DP_N$ supplied from the multiplexer unit 106, and supplies the generated output data signals to the output stage 110. The output stage 110 supplies the output data signals supplied thereto to the data lines D1 to Dm.

Figure 2:
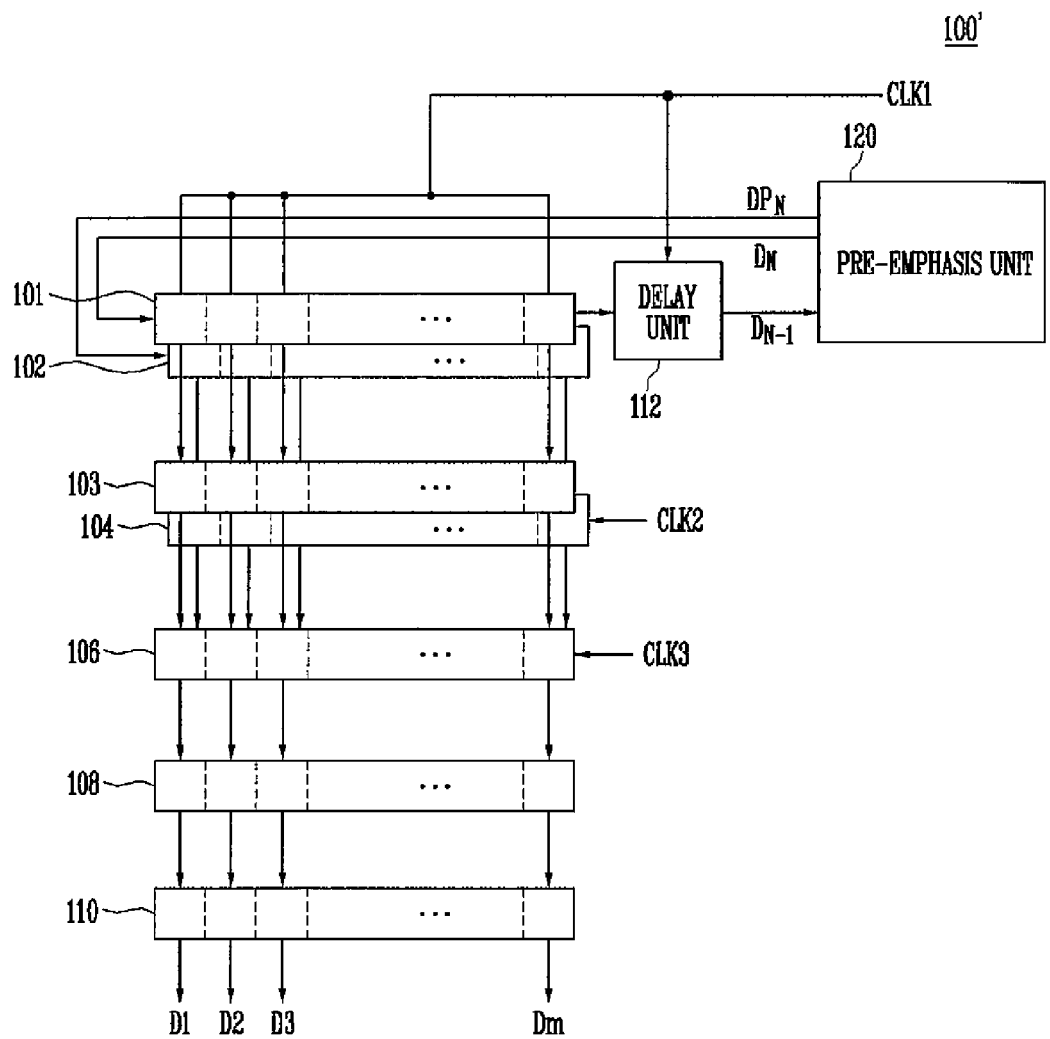
FIG. 2 is a schematic view illustrating a data driver according to a second embodiment of the present invention.

FIG. 2 is a schematic view illustrating a data driver 100' according to a second embodiment of the present invention. In FIG. 2, the same elements as the elements of FIG. 1 are denoted by the same reference numerals and detailed description thereof may not be repeated.

Referring to FIG. 2, the data driver 100' further includes a delay unit 112 positioned between the first register unit 101 and the pre-emphasis unit 120. The delay unit 112 delays input data signals from the first register unit 101 for a uniform time and supplies the delayed input data signals to the pre-emphasis unit 120.

In further detail, the delay unit 112 delays the input data signals of the first register unit 101 considering factors such as the operation time of the pre-emphasis unit 120 and/or the time for which the input data signals are supplied to the holding latch units 103 and 104, and supplies the delayed input data signals of the first register unit 101 to the pre-emphasis unit 120.

Figure 3:
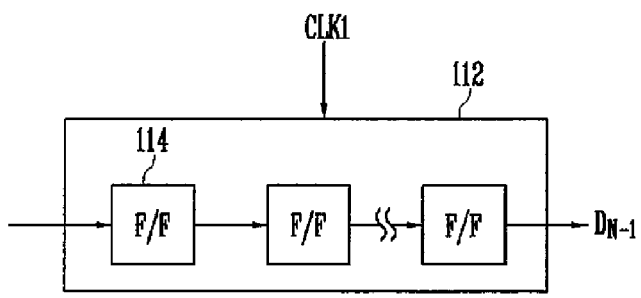
FIG. 3 is a schematic view illustrating the delay unit of FIG. 2.

FIG. 3 is a schematic view illustrating the delay unit 112 of FIG. 2. As illustrated in FIG. 3, in the delay unit 112, at least one flip-flop 114 driven by the first clock signal CLK1 may be serially provided.

Figure 4:
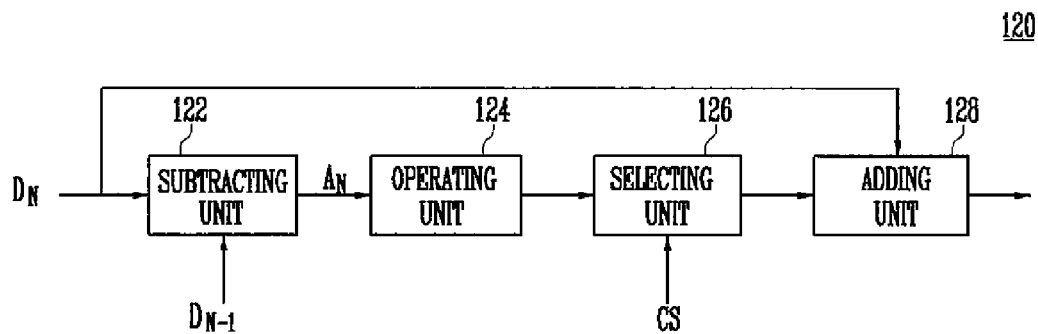
FIG. 4 is a schematic view illustrating the pre-emphasis unit of FIG. 2.

FIG. 4 is a schematic view illustrating the pre-emphasis unit of FIG. 2.

Referring to FIG. 4, the pre-emphasis unit 120 includes a subtracting unit 122, an operating unit 124, a selecting unit 126, and an adding unit 128. The subtracting unit 122 subtracts the previous input data signals $D_{N-1}$ from the corresponding current input data signals $D_N$ to generate subtraction data signals $A_N$ ($A_N = D_N - D_{N-1}$). The generated subtraction data signals $A_N$ are supplied to the operating unit 124. The subtraction data signals $A_N$ may be digital data signals (for example, binary encoded bit values).

The operating unit 124 divides the subtraction data signals $A_N$ by a plurality of numbers, for example, different powers of 2 (such as 4, 8, 16, and 32), to generate a plurality of corresponding operation data signals (such as first, second, third, and fourth operation data signals $B_N$, $C_N$, $E_N$, and $F_N$, respectively). The operation data signals $B_N$, $C_N$, $E_N$, and $F_N$ may be digital data signals (for example, binary encoded bit values).

Figure 5:
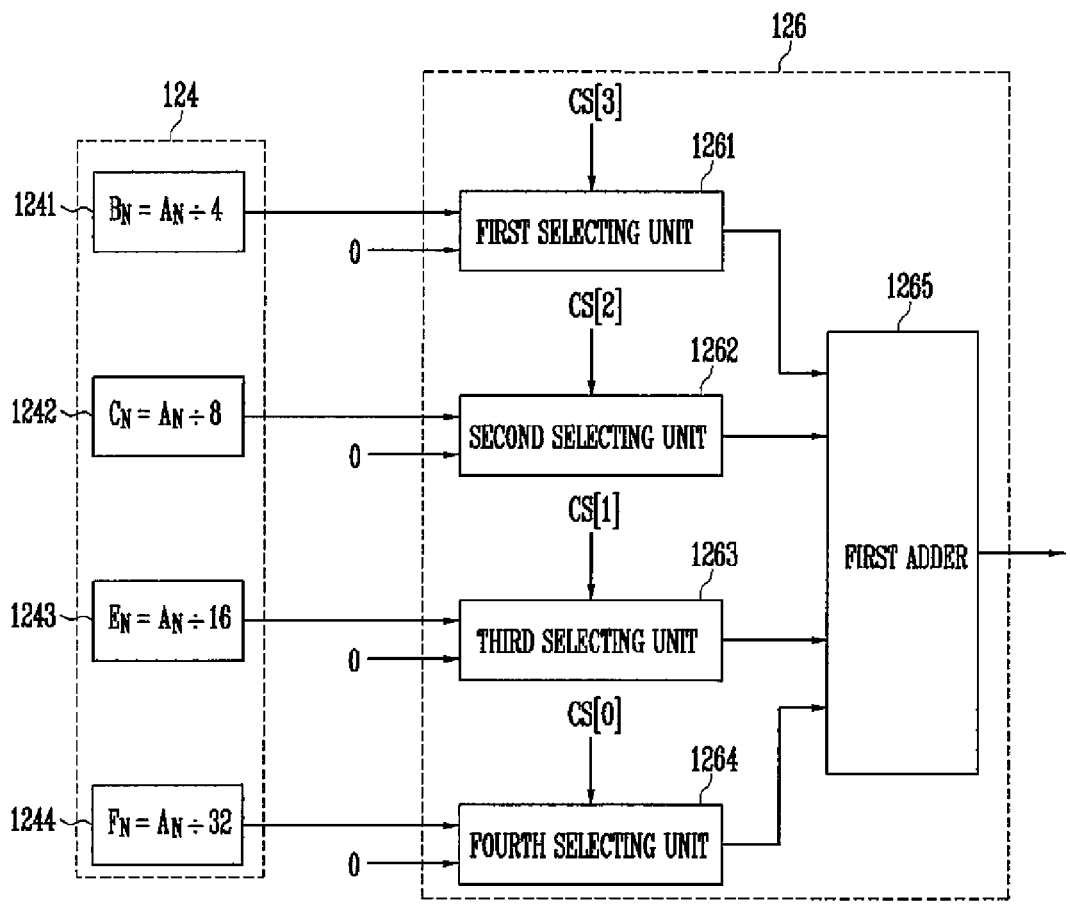
FIG. 5 is a schematic view illustrating the operating unit and the selecting unit of FIG. 4.

FIG. 5 is a schematic view illustrating the operating unit 124 and the selecting unit 126 of FIG. 4. As illustrated in FIG. 5, the operating unit 124 includes a plurality of division units

1241 to 1244. The division units 1241 to 1244 shift the subtraction data signals $A_N$ to the right to perform division operations (for example, bitwise division operations on bit values). The division units 1241 to 1244 divide the subtraction data signals $A_N$ by, for example, the different powers of 2. For example, the first division unit 1241 performs 2 bit shifts of the subtraction data signals $A_N$ to perform a divide-by-4 operation to generate the first operation data signals $B_N$. In a similar fashion, the second division unit 1242 performs 3 bit shifts of the subtraction data signals $A_N$ to perform a divide-by-8 operation to generate the second operation data signals $C_N$. By similar techniques, the third division unit 1243 performs a divide-by-16 operation and the fourth division unit 1244 performs a divide-by-32 operation to generate the third and fourth operation data signals $E_N$ and $F_N$, respectively.

The generated operation data signals $B_N$, $C_N$, $E_N$, and $F_N$ are supplied to the selecting unit 126. The selecting unit 126 supplies a combination or subset of (for example, at least one of) the operation data signals among the operation data signals $B_N$, $C_N$, $E_N$, and $F_N$ to the adding unit 128. As shown in FIG. 5, the selecting unit 126 includes first to fourth selecting units 1261 to 1264 (that is, as many selecting units as there are division units in the operating unit 124) and a first adder 1265. Each of the selecting units 1261 to 1264 receives a corresponding one of the operation data signals $B_N$, $C_N$, $E_N$, and $F_N$ along with a "0" input, and outputs one of the received operation data signals (i.e., one of $B_N$, $C_N$, $E_N$, and $F_N$) or "0" to correspond to a control signal CS (such as a plurality of control signals CS[3], CS[2], CS[1], and CS[0] corresponding to the first selecting unit 1261, the second selecting unit 1262, the third selecting unit 1263, and the fourth selecting unit 1264, respectively, as illustrated in FIG. 5). The first adder 1265 adds the outputs of the selecting units 1261 to 1264 and supplies the addition result to the adding unit 128.

As described above and shown in FIG. 5, the output of the first adder 1265 is illustrated in TABLE 1.

TABLE 1

| 1111 | $B_N + C_N + E_N + F_N$ | 46.875% |
|---|---|---|
| 1110 | $B_N + C_N + E_N$ | 43.75% |
| 1101 | $B_N + C_N + F_N$ | 40.625% |
| 1100 | $B_N + C_N$ | 37.5% |
| 1011 | $B_N + E_N + F_N$ | 34.375% |
| 1010 | $B_N + E_N$ | 31.25% |
| 1001 | $B_N + F_N$ | 28.125% |
| 1000 | $B_N$ | 25% |
| 0111 | $C_N + E_N + F_N$ | 21.875% |
| 0110 | $C_N + E_N$ | 18.75% |
| 0101 | $C_N + F_N$ | 15.675% |
| 0000 | $C_N$ | 12.5% |
| 0011 | $E_N + F_N$ | 9.375% |
| 0010 | $E_N$ | 6.25% |
| 0001 | $F_N$ | 3.125% |
| 0000 | 0 | 0% |

In TABLE 1, "0000" to "1111" in the first and fourth columns refers to the different combinations of the control signal CS (i.e., CS[3] to CS[0]) and "0" to "$B_N+C_N+E_N+F_N$" in the second and fifth columns refers to the corresponding combination of the operation data signals ($B_N$, $C_N$, $E_N$, $F_N$) selected by the control signal CS and added by the first adder 1265. In addition, "0%" to "46.875%" in the third and sixth columns refers to the corresponding (falling or rising) percents of the pre-emphasis data signals $DP_N$ compared with the subtraction data signals $A_N$, as computed with the operation data signals $B_N$, $C_N$, $E_N$, and $F_N$.

The added operation data signals output from the first adder 1265 are input to the adding unit 128. The adding unit 128 adds the added operation data signals to the current input data signals $D_N$ to generate the pre-emphasis data signals $DP_N$ and supplies the generated pre-emphasis data signals $DP_N$ to the second register unit 102 (for example, to correspond to the first clock signal CLK1).

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A data driver comprising:
   a pre-emphasis unit for:
   outputting current input data signals;
   inputting previous input data signals;
   comparing the previous input data signals with the current input data signals to generate pre-emphasis data signals; and
   outputting the pre-emphasis data signals;
   a first register unit for storing the current input data signals output from the pre-emphasis unit and for supplying the previous input data signals to the pre-emphasis unit; and
   a second register unit for storing the pre-emphasis data signals output from the pre-emphasis unit,
   wherein the pre-emphasis unit comprises:
   a subtracting unit for subtracting the previous input data signals from the current input data signals to generate subtraction data signals;
   an operating unit for dividing the subtraction data signals by different powers of 2 to generate a plurality of operation data signals;
   a selecting unit for selecting a subset of the operation data signals to correspond to a control signal and for outputting a first sum of the selected operation data signals; and
   an adding unit for adding the first sum to the current input data signals.

2. The data driver as claimed in claim 1, wherein the first register unit comprises a first first-in-first-out (FIFO) register to store the current input data signals to correspond to a first clock signal.

3. The data driver as claimed in claim 2, wherein the second register unit comprises a second FIFO register.

4. The data driver as claimed in claim 2, further comprising a delay unit between the first register unit and the pre-emphasis unit.

5. The data driver as claimed in claim 4, wherein the delay unit comprises at least one flip-flop driven by the first clock signal.

6. The data driver as claimed in claim 1, further comprising:
   a first holding latch unit for storing the current input data signals stored in the first register unit;
   a second holding latch unit for storing the pre-emphasis data signals stored in the second register unit;
   a multiplexer unit coupled to the first holding latch unit and the second holding latch unit to output one of the current input data signals or the pre-emphasis data signals to channels using multiplexers in the channels; and
   a signal generator for generating output data signals using the data signals output from the multiplexer unit and supplying the generated output data signals to data lines.

7. The data driver as claimed in claim 6, further comprising an output stage positioned between the signal generator and the data lines, and including buffers in the channels.

8. The data driver as claimed in claim 1,
wherein the operating unit comprises a plurality of division units, and
wherein each of the division units generates a corresponding one of the operation data signals by shifting the subtraction data signals by a corresponding number of bits.

9. A method of driving a data driver comprising a pre-emphasis unit, a first register unit, and a second register unit, the pre-emphasis unit comprising a subtracting unit for subtracting previous input data signals from current input data signals to generate subtraction data signals, an operating unit for dividing the subtraction data signals by different powers of 2 to generate a plurality of operation data signals, a selecting unit for selecting a subset of the operation data signals to correspond to a control signal and for outputting a first sum of the selected operation data signals, and an adding unit for adding the first sum to the current input data signals, the method comprising:
- outputting the current input data signals from the pre-emphasis unit;
- supplying the current input data signals output from the pre-emphasis unit to the first register unit while receiving the previous input data signals in the pre-emphasis unit from the first register unit;
- comparing the current input data signals with the previous input data signals in the pre-emphasis unit to generate pre-emphasis data signals;
- outputting the pre-emphasis data signals from the pre-emphasis unit;
- storing the current input data signals output from the pre-emphasis unit in the first register unit and supplying the previous input data signals from the first register unit to the pre-emphasis unit;
- storing the pre-emphasis data signals output from the pre-emphasis unit in the second register unit;
- generating first output data signals using the pre-emphasis data signals and generating second output data signals using the current input data signals; and
- supplying the first output data signals and the second output data signals to data lines at different times.

10. The method as claimed in claim 9, wherein the first register unit and the second register unit comprise first-in-first-out (FIFO) registers.

11. The method as claimed in claim 9, wherein generating the pre-emphasis data signals comprises:
- subtracting the previous input data signals from the current input data signals by the subtraction unit to generate the subtraction data signals;
- dividing the subtraction data signals by the different powers of 2 using the operating unit to generate the plurality of operation data signals;
- selecting the subset of the operation data signals by the selecting unit and outputting the first sum of the selected operation data signals; and
- adding the first sum to the current input data signals by the adding unit to generate the pre-emphasis data signals.

* * * * *